(12) United States Patent
Adamec et al.

(10) Patent No.: US 8,008,629 B2
(45) Date of Patent: Aug. 30, 2011

(54) CHARGED PARTICLE BEAM DEVICE AND METHOD FOR INSPECTING SPECIMEN

(75) Inventors: Pavel Adamec, Haar (DE); Shemesh Dror, Hod-Hasharon (IL)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 376 days.

(21) Appl. No.: 11/781,794

(22) Filed: Jul. 23, 2007

(65) Prior Publication Data

US 2008/0048116 A1    Feb. 28, 2008

(30) Foreign Application Priority Data

Jul. 24, 2006 (EP) .................................... 06015379

(51) Int. Cl.
*G01N 23/00* (2006.01)
(52) U.S. Cl. .................... 250/396 R; 250/307; 250/310; 250/311; 250/399; 250/396 ML
(58) Field of Classification Search ................. 250/306, 250/307, 310, 311, 396 R, 398, 399, 396 ML, 250/492.3; 850/9, 63
See application file for complete search history.

(56) References Cited

U.S. PATENT DOCUMENTS

| 3,483,373 | A | | 12/1969 | Asmus et al. | |
|---|---|---|---|---|---|
| 4,044,254 | A | * | 8/1977 | Krisch et al. | 250/311 |
| 4,209,698 | A | * | 6/1980 | Hoppe | 250/311 |
| 4,596,929 | A | | 6/1986 | Coates et al. | |
| 4,757,208 | A | * | 7/1988 | McKenna et al. | 250/492.2 |
| 5,063,294 | A | * | 11/1991 | Kawata et al. | 850/63 |
| 5,422,486 | A | * | 6/1995 | Herrmann et al. | 250/396 R |
| 5,894,124 | A | * | 4/1999 | Iwabuchi et al. | 250/310 |
| 6,534,766 | B2 | * | 3/2003 | Abe et al. | 250/307 |
| 6,559,463 | B2 | * | 5/2003 | Ono et al. | 250/492.22 |
| 6,586,746 | B1 | * | 7/2003 | Messick et al. | 250/396 R |
| 6,614,026 | B1 | * | 9/2003 | Adamec | 250/398 |
| 6,717,144 | B2 | * | 4/2004 | Kimura et al. | 850/9 |
| 6,747,279 | B2 | * | 6/2004 | Adamec | 250/396 ML |
| 6,787,772 | B2 | * | 9/2004 | Ose et al. | 850/9 |
| 6,815,698 | B2 | * | 11/2004 | Nagano et al. | 250/492.22 |
| 6,855,939 | B2 | * | 2/2005 | Rose et al. | 250/396 R |
| 6,881,956 | B1 | * | 4/2005 | Jau et al. | 250/311 |
| 6,943,360 | B1 | * | 9/2005 | Mankos | 250/492.2 |

(Continued)

FOREIGN PATENT DOCUMENTS

EP    1648018 A1    4/2006

(Continued)

OTHER PUBLICATIONS

European Search Report dated Mar. 9, 2007.

*Primary Examiner* — Robert Kim
*Assistant Examiner* — Michael J Logie
(74) *Attorney, Agent, or Firm* — Patterson & Sheridan, L.L.P.

(57) ABSTRACT

A charged particle beam device is provided. The device includes a primary objective lens for focusing a primary charged particle beam, the primary objective lens defining an optical axis, a specimen stage defining a specimen location area, a deflection unit for deflecting the primary charged particle beam between the primary objective lens and the specimen location area, towards a beam path for impingement on the specimen, wherein the deflection unit is movable with respect to the optical axis.

3 Claims, 8 Drawing Sheets

U.S. PATENT DOCUMENTS

| | | | |
|---|---|---|---|
| 7,067,807 B2 * | 6/2006 | Petrov et al. | 250/307 |
| 7,075,078 B2 * | 7/2006 | Ose et al. | 250/311 |
| 7,105,833 B2 * | 9/2006 | Brunner et al. | 250/396 R |
| 7,138,641 B2 * | 11/2006 | Matsushita et al. | 250/396 R |
| 7,202,476 B2 * | 4/2007 | Suga et al. | 250/310 |
| 7,223,974 B2 * | 5/2007 | Petrov et al. | 250/310 |
| 7,233,008 B1 * | 6/2007 | Petrov et al. | 250/396 ML |
| 7,326,927 B2 * | 2/2008 | Frosien | 250/310 |
| 7,335,894 B2 * | 2/2008 | Frosien et al. | 250/396 R |
| 7,351,971 B2 * | 4/2008 | Tanaka et al. | 250/310 |
| 7,352,195 B2 * | 4/2008 | Watanabe et al. | 324/754.22 |
| 7,394,066 B2 * | 7/2008 | Murakoshi et al. | 250/310 |
| 7,491,945 B2 * | 2/2009 | Nagano | 250/396 R |
| 7,528,614 B2 * | 5/2009 | Bullock | 324/752 |
| 2002/0084411 A1 * | 7/2002 | Yamazaki et al. | 250/306 |
| 2003/0062478 A1 * | 4/2003 | Frosien et al. | 250/310 |
| 2004/0000640 A1 * | 1/2004 | Kazumori | 250/310 |
| 2004/0173746 A1 * | 9/2004 | Petrov et al. | 250/310 |
| 2004/0188610 A1 * | 9/2004 | Hirose | 250/310 |
| 2005/0006600 A1 * | 1/2005 | Shichi et al. | 250/492.21 |
| 2005/0035292 A1 * | 2/2005 | Adamec et al. | 250/310 |
| 2005/0139773 A1 | 6/2005 | Ose et al. | |
| 2005/0253066 A1 * | 11/2005 | Watanabe et al. | 250/310 |
| 2006/0151711 A1 * | 7/2006 | Frosien et al. | 250/396 ML |
| 2006/0151713 A1 * | 7/2006 | Adamec | 250/396 ML |
| 2006/0163479 A1 * | 7/2006 | Kaji et al. | 250/310 |

FOREIGN PATENT DOCUMENTS

| | | |
|---|---|---|
| JP | 02061952 A | 3/1990 |
| JP | 07201298 A | 8/1995 |
| JP | 10275585 A | 10/1998 |
| JP | 2001148227 A | 5/2001 |
| JP | 2001273861 A | 10/2001 |

* cited by examiner

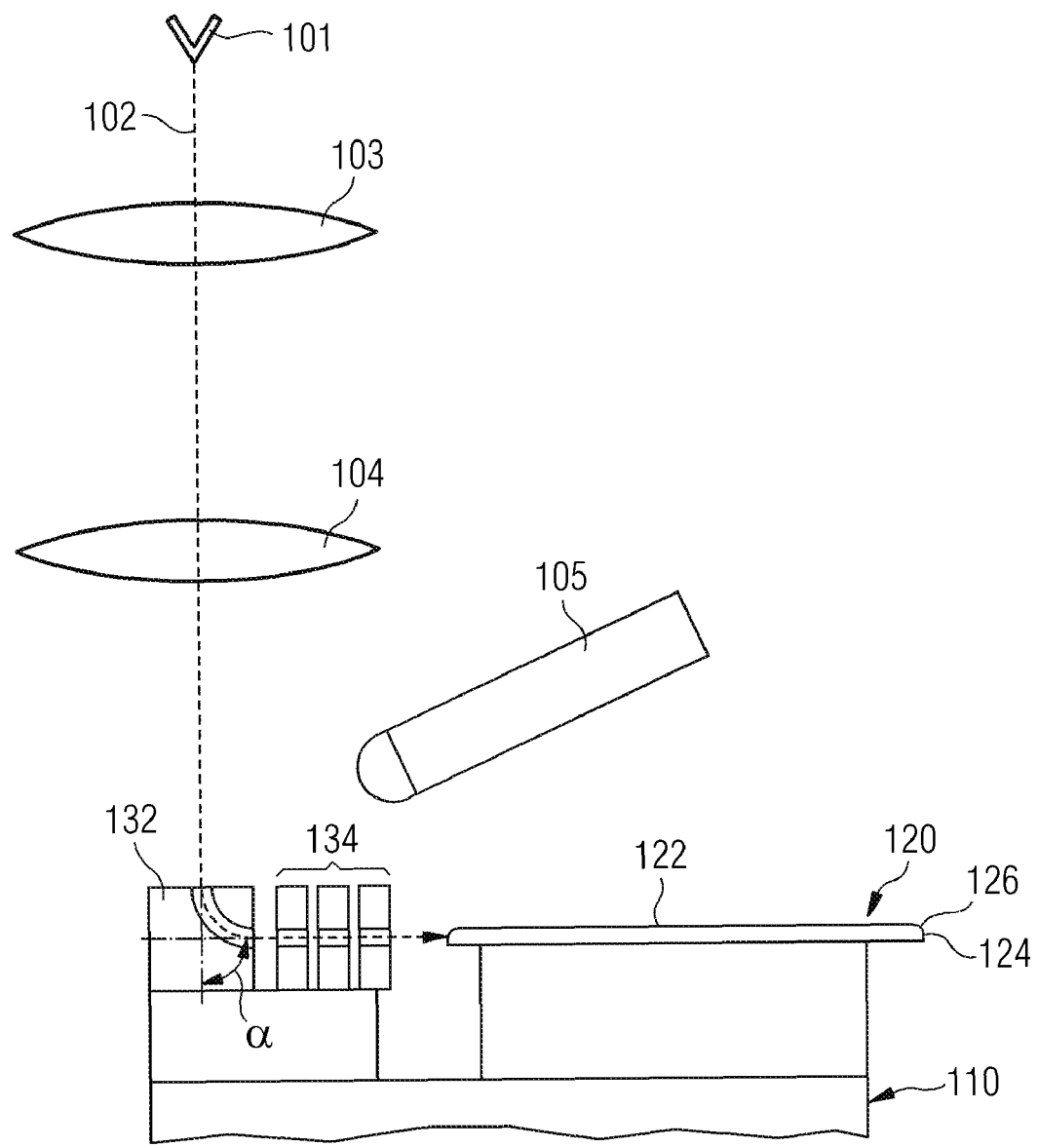

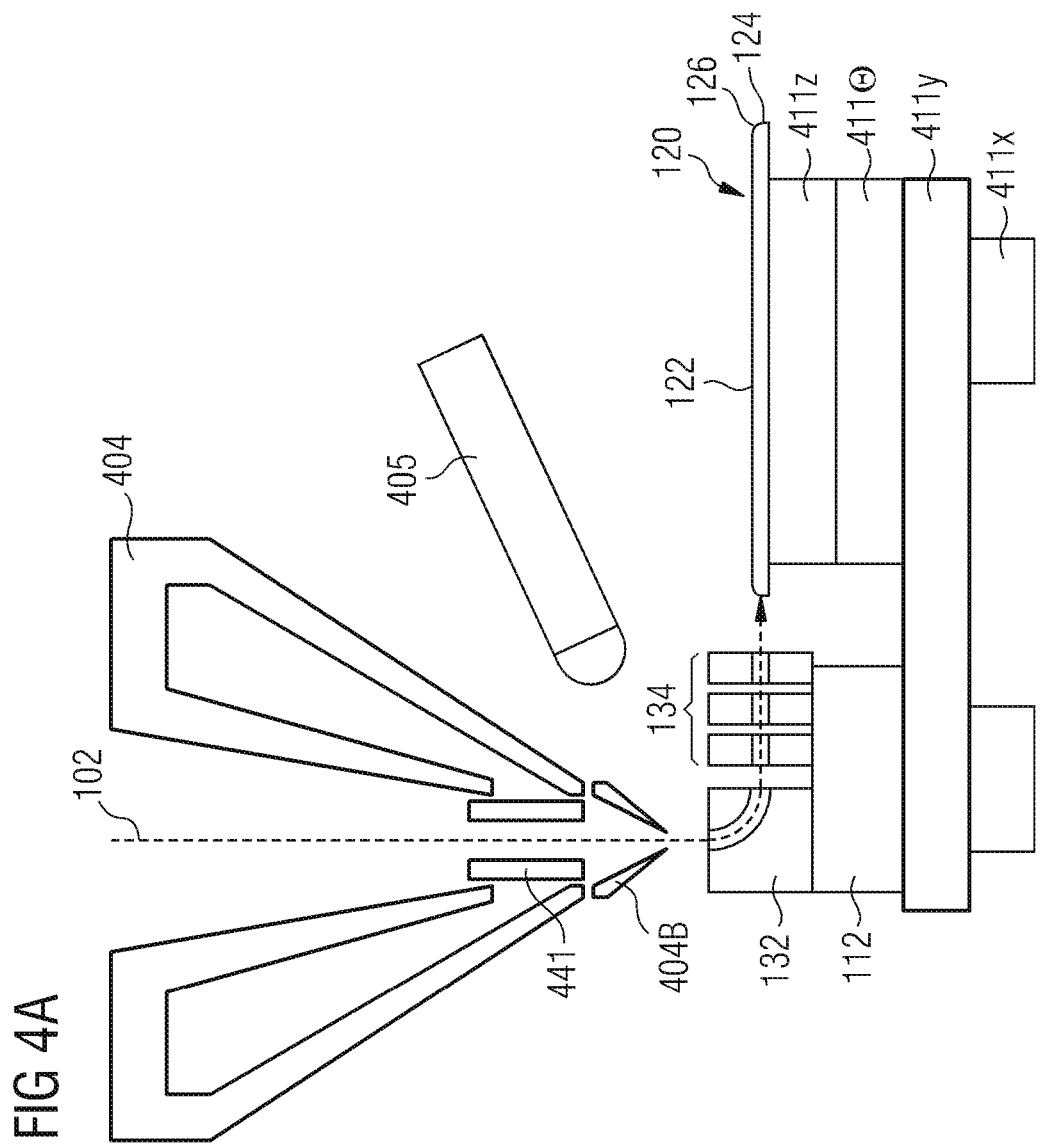

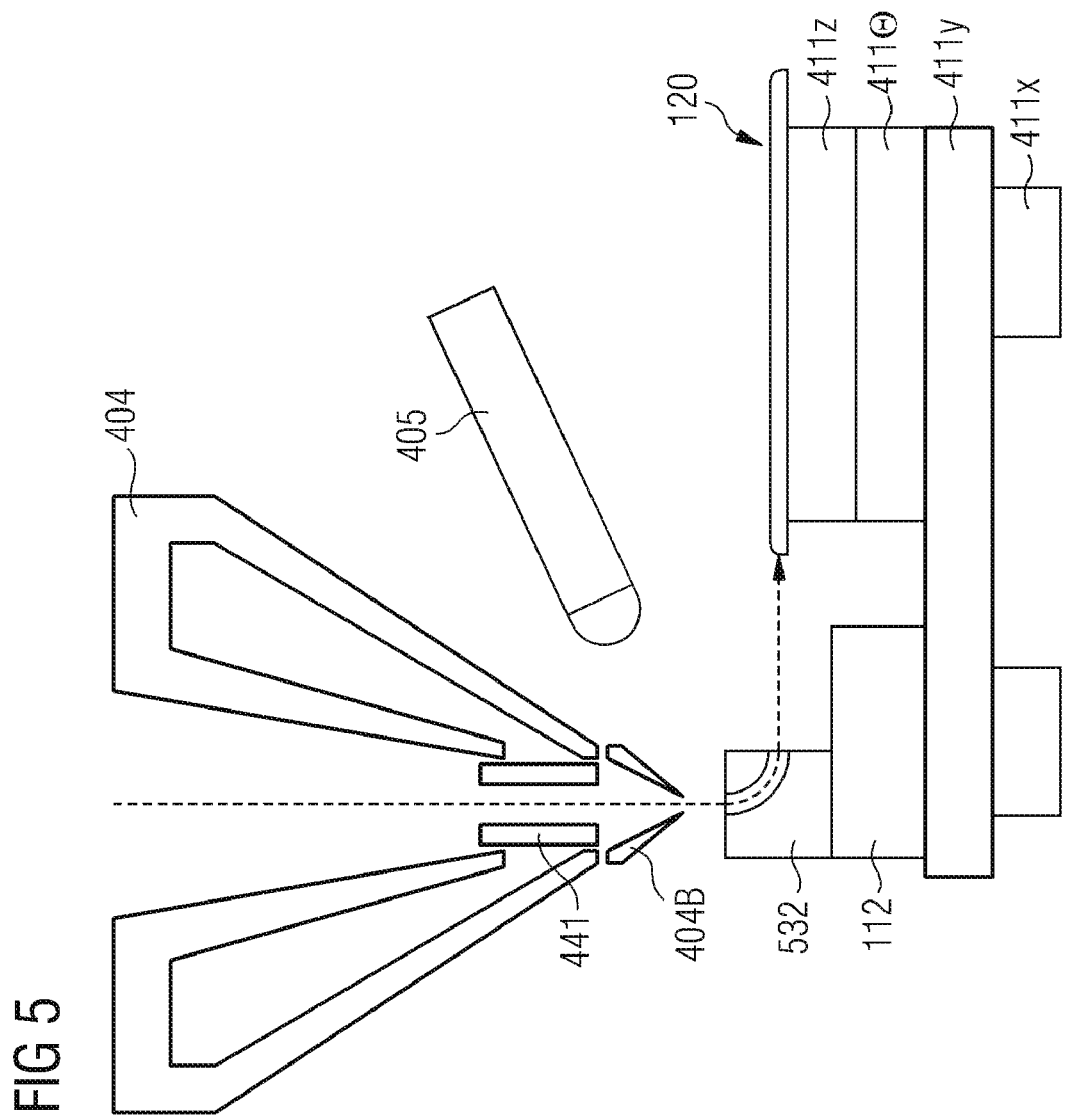

CHARGED PARTICLE BEAM DEVICE AND METHOD FOR INSPECTING SPECIMEN

CROSS-REFERENCE TO RELATED APPLICATIONS

This application claims priority to European Patent Application No. 06015379.8, filed Jul. 24, 2006, which is herein incorporated by reference.

FIELD OF THE INVENTION

The invention generally relates to a charged particle beam device and a method of imaging specimen with a charged particle beam, particularly for inspection applications, testing applications, lithography applications and the like. More particularly, it relates to a specimen bevel imaging apparatus, a high tilt angle apparatus and a method of inspecting specimen with a corresponding apparatus. Specifically, it relates to a charged particle beam device and a method of inspecting a specimen with a charged particle beam device.

BACKGROUND OF THE INVENTION

Charged particle beam apparatuses have many functions in a plurality of industrial fields, including, but not limited to, inspection of semiconductor devices during manufacturing, exposure systems for lithography, detecting devices and testing systems. Thus, there is a high demand for structuring and inspecting specimens within the micrometer and nanometer scale.

Micrometer and nanometer scale process control, inspection or structuring, is often done with charged particle beams, e.g. electron beams, which are generated and focused in charged particle beam devices, such as electron microscopes or electron beam pattern generators. Charged particle beams offer superior spatial resolution compared to, e.g. photon beams, due to their short wavelengths.

The signals generated, for example, by a primary electron beam can be collected from practically all parts of a relatively rough surface. Peeling off of individual layers deposited on the specimen or cracks in the specimen might be visible from the edge of the specimen that is to be inspected. It can be desirable to inspect the edge or bevel of the specimen. Further, it may be desirable to inspect a portion of the lower edge or bevel of a specimen or a portion of the bottom surface of the specimen.

SUMMARY OF THE INVENTION

In light of the above, the present invention intends to provide an improved charged particle beam device and an improved method of operating charged particle beam devices.

The object is solved by the charged particle device according to independent claim 1, and by the method of inspecting a specimen according to independent claim 16.

According to one embodiment, a charged particle beam device is provided. The charged particle beam device includes a primary objective lens for focusing a primary charged particle beam, the primary objective lens defining an optical axis. The charged particle beam device includes a specimen stage defining a specimen location area, and a deflection unit for deflecting the primary charged particle beam between the primary objective lens and the specimen location area towards a beam path for impingement on the specimen, wherein the deflection unit is adapted to generate a deflection angle between the optical axis and the beam path for impingement of at least about 60°.

According to another embodiment, a charged particle beam device is provided. The charged particle beam device includes a primary objective lens for focusing a primary charged particle beam, the primary objective lens defining an optical axis. The charged particle beam device includes a specimen stage defining a specimen location area, and a deflection unit for deflecting the primary charged particle beam between the primary objective lens and the specimen location area towards a beam path for impingement on the specimen, wherein the deflection unit is movable with respect to the optical axis.

According to a further embodiment, a method of inspecting a specimen with a charged particle beam device is provided. The method includes: generating a primary charged particle beam, inspecting the specimen in a first mode. The first mode includes deflecting the primary charged particle beam between a primary objective lens and the specimen towards a bevel or towards an edge of the specimen.

Typically, the method may further include: inspecting the specimen in a second mode. The second mode includes inspecting the surface of a specimen with a primary charged particle beam.

Further advantages, features, aspects and details that can be combined with the above embodiments are evident from the dependent claims, the description and the drawings.

Inspection or testing of specimen may also include the edge or the bevel of the specimen. In order to image all potentially relevant areas of the specimen, that is the structured surface, the edge, or the bevel, a mechanical movement of the specimen might be possible. However, such a mechanical movement is imprecise and slow. Therefore, embodiments described herein provide improved apparatuses and improved methods to measure the bevel, the edge and/or a portion of the lower surface of a specimen. Some embodiments allow the additional measurement of the structured surface of the specimen.

Embodiments are also directed to apparatuses for carrying out the disclosed methods and including apparatus parts for performing each described method steps. These method steps may be performed by way of hardware components, a computer programmed by appropriate software, by any combination of the two or in any other manner. Furthermore, embodiments are also directed to methods by which the described apparatus operates. It includes method steps for carrying out every function of the apparatus or manufacturing every part of the apparatus.

BRIEF DESCRIPTION OF THE DRAWINGS

Some of the above indicated and other more detailed aspects of the invention will be described in the following description and partially illustrated with reference to the figures. Therein:

FIG. 1 shows a schematic view of a first embodiment of a charged particle beam device including a deflection unit and a post-deflection lens for imaging an edge or a bevel of a specimen;

FIG. 4A shows a schematic view of an embodiment of a charged particle beam device including a deflection unit and a post-deflection lens for imaging an edge or a bevel of a specimen;

FIG. 5 shows a schematic view of an embodiment of a charged particle beam device including a deflection unit for imaging an edge or a bevel of a specimen;

DETAILED DESCRIPTION OF THE DRAWINGS

Figure 2A:
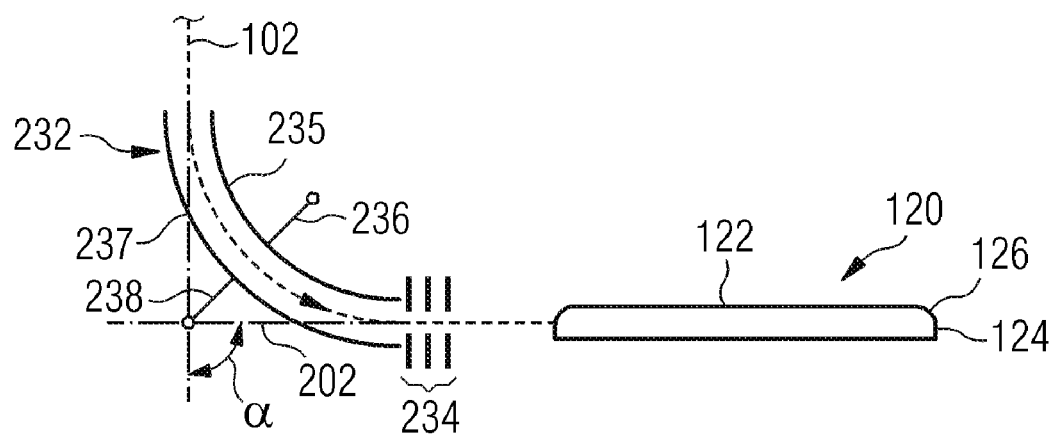
FIGS. 2A to 2C show embodiments of deflection units for edge or bevel imaging.

Without limiting the scope of the present application, in the following the charged particle beam device or components thereof will exemplarily be referred to as an electron beam device or components thereof. Thereby, the electron beam might especially be utilized for inspection or lithography. The present invention can still be applied for apparatuses and components using other sources of charged particles and/or other secondary and/or backscattered charged particles to obtain a specimen image or to pattern a specimen.

Within the following description of the drawings, the same reference numbers refer to the same components. Generally, only the differences with respect to the individual embodiments are described.

A "specimen" as referred to herein, includes, but is not limited to, semiconductor wafers, semiconductor workpieces, and other workpieces such as optical planks, memory disks and the like. Embodiments of the invention may be applied to any generally flat workpiece on which material is deposited or which are structured. A specimen includes a flat surface to be structured or on which layers are deposited, an opposing surface, an edge, and typically a bevel.

FIG. 1 illustrates a first embodiment. An electron emitter 101 emits a primary electron beam along optical axis 102. Condenser lens 103 forms the primary electron beam. The primary objective lens 104 focuses the primary charged particle beam.

Primary objective lens 104 is referred to as "primary" because, according to the definition of an objective lens, the objective lens is defined as the lens closest to the specimen. In light of the above, within the embodiments described herein, a lens can, for example, be the objective lens for one application and can be a lens in general for another application. When measuring or inspecting the surface 122 of the specimen 120 as, for example, described with respect to FIG. 4b, primary objective lens 104 (404) is the objective lens according to the above mentioned definition. Further, without the deflection unit 123 and the post-deflection lens 134, primary objective lens 104 would be considered the objective lens of the system by a person skilled in the art. Therefore, even though post-deflection lens 134 might be closest to the specimen and, thus, according to the above-mentioned definition, the objective lens of the system for some applications, lens 104 is referred to as the primary objective lens and lens 134 is referred to as a post-deflection lens. The same denotation is used for corresponding lenses of other embodiments. Nevertheless, lenses referred to as primary objective lenses are to be understood as being capable of being objective lenses for at least some applications or some operations modi.

Within the embodiment shown in FIG. 1, other beam guiding means like apertures, scanning deflectors, alignment deflectors, aberration correctors, and the like can be provided before the primary electron beam enters deflection unit 132.

Within deflection unit 132, the primary electron beam is deflected by a deflection angle $\alpha$. The deflection angle $\alpha$ is significantly larger than deflection angles used for scanning deflection or electrical beam tilt mechanisms. Typically, the deflection angle is between 60° and 135°. According to one embodiment, the deflection angle can be between 80° and 100°. Typically, the deflection angle is about 90°. A post-deflection lens 134 focuses the primary electron beam on the edge 124 or the bevel 126 of the specimen 120. The specimen 120, deflection unit 132, and post-deflection lens 134 are located on a stage 110.

With in FIG. 1, post-deflection lens 134 is an Einzel lens. Post-deflection lens 134 includes three electrodes. Thereby, the center electrode is on a different potential than the two outer electrodes. According to another embodiment, a post-deflection lens with less than three electrodes, for example, two electrodes can be used. The lens formed by to electrodes accelerates or deceleration the primary electron beam. Thereby, the beam landing energy of the primary electron beam from the specimen can be further varied as compared to the primary beam energy within the column. The different post-deflection lenses described above, may also be combined with other embodiments described herein.

On impingement of the primary electron beam on the edge 124 or the bevel 126 of the specimen 120, secondary or backscattered particles are released from the specimen. These particles can be detected by detector 105. The corresponding signal in combination with a scanning movement of the primary charged particle beam can, for example, be utilized to generate an image of the edge 124 or the bevel 126 of specimen 120.

FIG. 1 shows schematically a condenser lens 103 and a primary objective lens 104. According to one embodiment, condenser lens can be a magnetic lens including excitation coils. Primary objective lens can be a combined electrostatic magnetic lens. A combined electrostatic magnetic lens includes a pole piece and an excitation coil. Further, a lens electrode, typically below the pole piece, is included. The lens electrode may, for example, provide a deceleration lens.

According to other embodiments, each or both of the lenses 103 and 104 may be electrostatic lenses in general, Einzel lenses, magnetic lenses, combined electrostatic magnetic lenses, deceleration lenses, acceleration lenses, or combinations thereof. Different types of lenses are described in more detail in, e.g., "*High Precision electron optical system for absolute and CD-measurements on large specimens*" by J. Frosien, S. Lanio, H. P. Feuerbaum, Nuclear Instruments and Methods in Physics Research A, 363 (1995, which is herewith incorporated in its entirety.

Embodiments of deflection units that can be used in any of the embodiments of FIG. 1, or FIGS. 4 to 7, are described in FIGS. 2A to 3D. According to one embodiment, shown in FIG. 2A, the charged particle beam device includes a deflection unit 232 in form of a sector field deflection unit which is capable of deflecting the primary charged particle beam. Typically, the sector field deflection unit is capable of deflecting the primary charged particle beam in a direction essentially perpendicular to the propagation direction of the beam of primary charged particles. According to another embodiment, the sector field deflection unit acts additionally as a focusing unit, i.e., a lens. Sector field deflection unit 232 in FIG. 2A has a negatively-charged electrode 237 and a positively-charged electrode 235 serving to bend the electron beam. The potentials can be applied via connections 236 and 238, respectively. The electrostatic sector field deflection unit includes two electrodes 237 and 235 providing a focusing action on the electron beam in one dimension.

The embodiment shown in FIG. 2A further includes a post-deflection lens 234. Post-deflection lens 234 is, according to one embodiment, provided as an Einzel lens including three electrodes. According to other embodiments, as described with respect to FIG. 1, other lenses can be used to focus the primary electron beam on the edge 124 or the bevel 126 of the specimen 120.

Within FIG. 2A, deflection angle α is illustrated being about 90°. That is the angle between the optical axis 102 and the electron beam propagation direction 202 before impingement of the primary electron beam on the specimen 120 is about 90°.

Generally, sector field deflection units that might be combined with the embodiments disclosed herein can be electrostatic, magnetic or combined electrostatic-magnetic. Since the space required for an electrostatic bending sector is smaller than the space needed for a sector including a magnetic part, typically an electrostatic sector is used. For example, a non-hemispherical, electrostatic bending sector may have two electrodes which are shaped roundly. The sector field deflection unit may have additional side plates. It can further be combined with an astigmatic focusing element like a cylinder lens, a quadrupole, or the like. According to further embodiments, the sector field deflectors may by spherical or ellipsoid, sometimes referred to as toroidal.

According to embodiments described herein, the radii of curvature of the sector field deflection units can be from about 5 mm to about 40 mm. According to one embodiment, the radii of curvature can be about 10 mm to 13 mm.

Figure 2B:
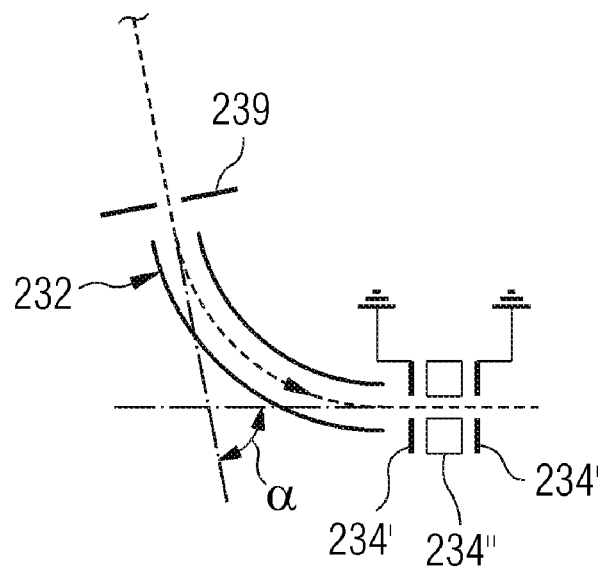

Within the embodiment shown in FIG. 2B, the post-deflection lens is provided by two grounded electrodes 234'. The center electrode is provided in form of a tube 234". The deflection angle of the deflection unit 232 is shown to be less than 90°.

Generally, for all embodiments described herein, the deflection angles are significantly larger than deflection angles generated for scanning an electron beam over a specimen or generated for a beam tilt of the primary electron beam to obtain a stereoscopic image, or the like. The deflection angles are typically in the range of 60 to 135°, or even higher, for example, up to 180°. They can also be in the range of 70° to 90°. Generally, the deflection angles have to be sufficiently large to measure the edge or the bevel of the specimen.

According to a further embodiment, it can be desirable to measure the lower edge or bevel of the specimen. Further, it can even be desirable to measure a portion of the lower surface (the opposite surface of the specimen surface to be processed). In this case, the deflection angle is typically larger than 90°. It can be in the range of above 90° to 145°. The inspection of the lower specimen portions can be realized according to two options or a combination thereof. On the one hand, the sector field deflector can introduce a deflection angle above 90°. On the other hand, the electron beam column and the specimen stage can be tilted with respect to each other. If, for example, the optical axis of the electron beam column is tilted, a deflection angle of 90°, below 90° or above 90° enables an impingement of the electron beam on the lower surface of the specimen. A tilt of the optical axis of the electron beam column and the specimen stage with respect to each other can, according to another embodiment, also be combined with a deflection in a sector field that is larger than 90°.

Generally, an electrostatic beam bending sector field deflector can be either cylindrical or hemispherical. The cylindrical type suffers from the fact that as the beam is bent the electrons are focused in one plane and not in the other plane substantially perpendicular thereto. A hemispherical bending sector field deflector focuses the secondary beam in both planes. The cylindrical sector field deflector can be used with side plates biased to achieve focusing in the transverse plane, yielding similar focusing properties to the hemispherical sector. For instance, side plates (not shown) could be positioned with respect to the perspective of FIG. 2A in front of and behind the gap between the sector field electrodes 235 and 237.

Figure 2C:
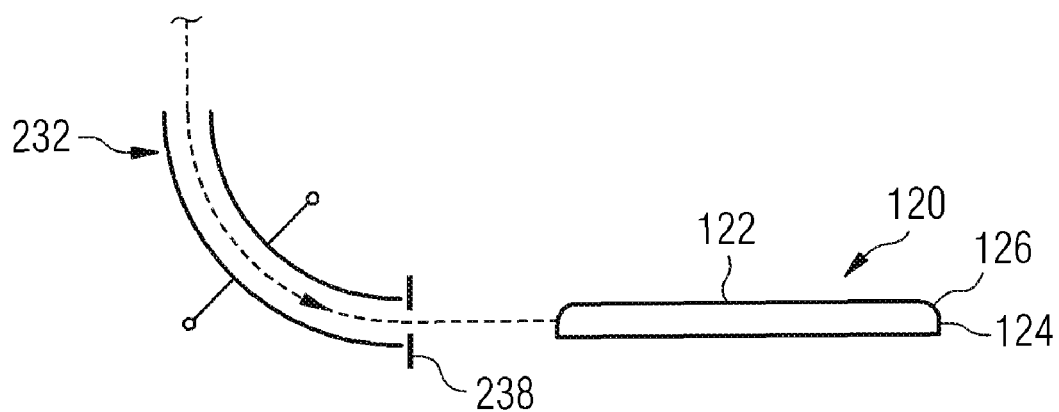

In the embodiment shown in FIG. 2C, the charged particle beam device includes a deflection unit 232 in form of a sector field deflection unit. The electrostatic sector field deflection unit including two electrodes providing a focusing action on the electron beam in one dimension. A focusing in the second dimension can be provided by quadrupole element 238. The quadrupole element 48 could also be applied in the other embodiments described herein. Optionally, a pair of side plates can be provided. Further, it may be possible to use a cylinder lens instead of a quadrupole to obtain focusing of the combination of the sector field deflection unit and the cylinder lens or quadrupole, respectively, with reduced astigmatism.

Generally, within the embodiments described herein, electrostatic deflectors, magnetic deflectors, or combined electrostatic magnetic deflectors can be used. In light of the generated deflection angles, typically sector field deflectors can be used. According to embodiments, a combined electrostatic magnetic sector field deflector can be used. Thereby, additional aberration correction might be included in the sector field deflector.

Figure 3:
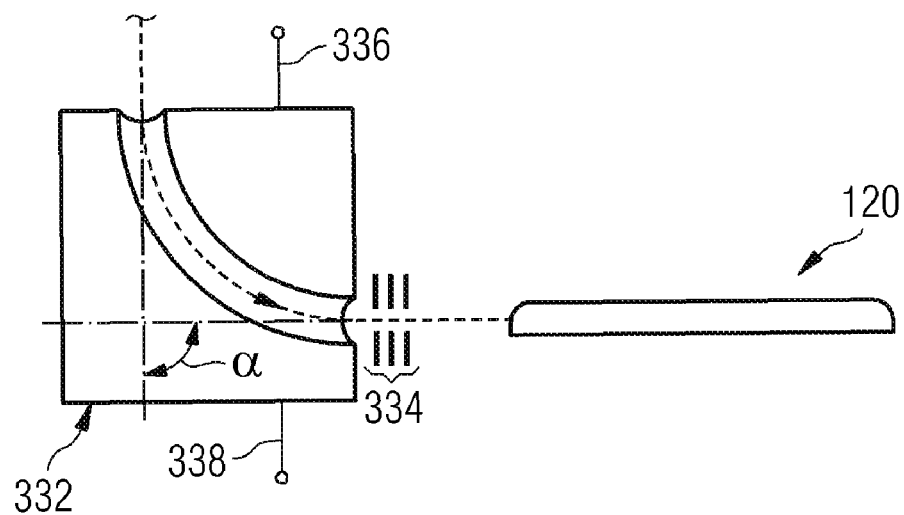
FIG. 3 shows another embodiment of a deflection unit for edge or bevel imaging.

Within FIG. 3, the sector field deflection unit is shown as a hemispherical sector field unit 332. The potentials can be applied via connections 236 and 238, respectively. The hemispherical sector field unit allows for a stigmatic focusing property of the sector field unit. Thus, less astigmatism is introduced. Further, a post-deflection lens 334 in the form of an Einzel lens including three electrodes is shown. According to other embodiments, other lenses can be used to focus the primary electron beam.

Since a hemispherical sector field unit allows for a stigmatic focusing property of the sector field unit, according to a further embodiment, no additional focusing unit is required. In light thereof, the post-deflection lens 334 may be omitted.

The above described sector field deflection units focus the primary charged particle beam to some degree at least in the plane of deflection. If a hemispherical sector field deflection unit is provided, the sector field deflection unit focuses the primary charged particle beam in at least two planes substantially perpendicular to each other. Generally, the focusing property of the sector might be considered insufficient for high resolution applications. However, depending on the resolution requirements of the application the focusing property of the sector field deflection unit can be used to focus the beam on the edge or the bevel of the specimen. Thereby, images can be generated without a post-deflection lens.

If higher resolutions, e.g., below 100 nm are required, a post-deflection lens can be applied as for example shown in the embodiments described with respect to FIGS. 2A, 2C, and 3. The resolution values partly scale based on the dimension of the components. Thus, the value of 100 nm, which is given exemplarily for focusing with about a 10 mm radius of curvature, may be in the range of 50 nm to 300 nm based on the dimensions of the optical components.

Figure 4B:
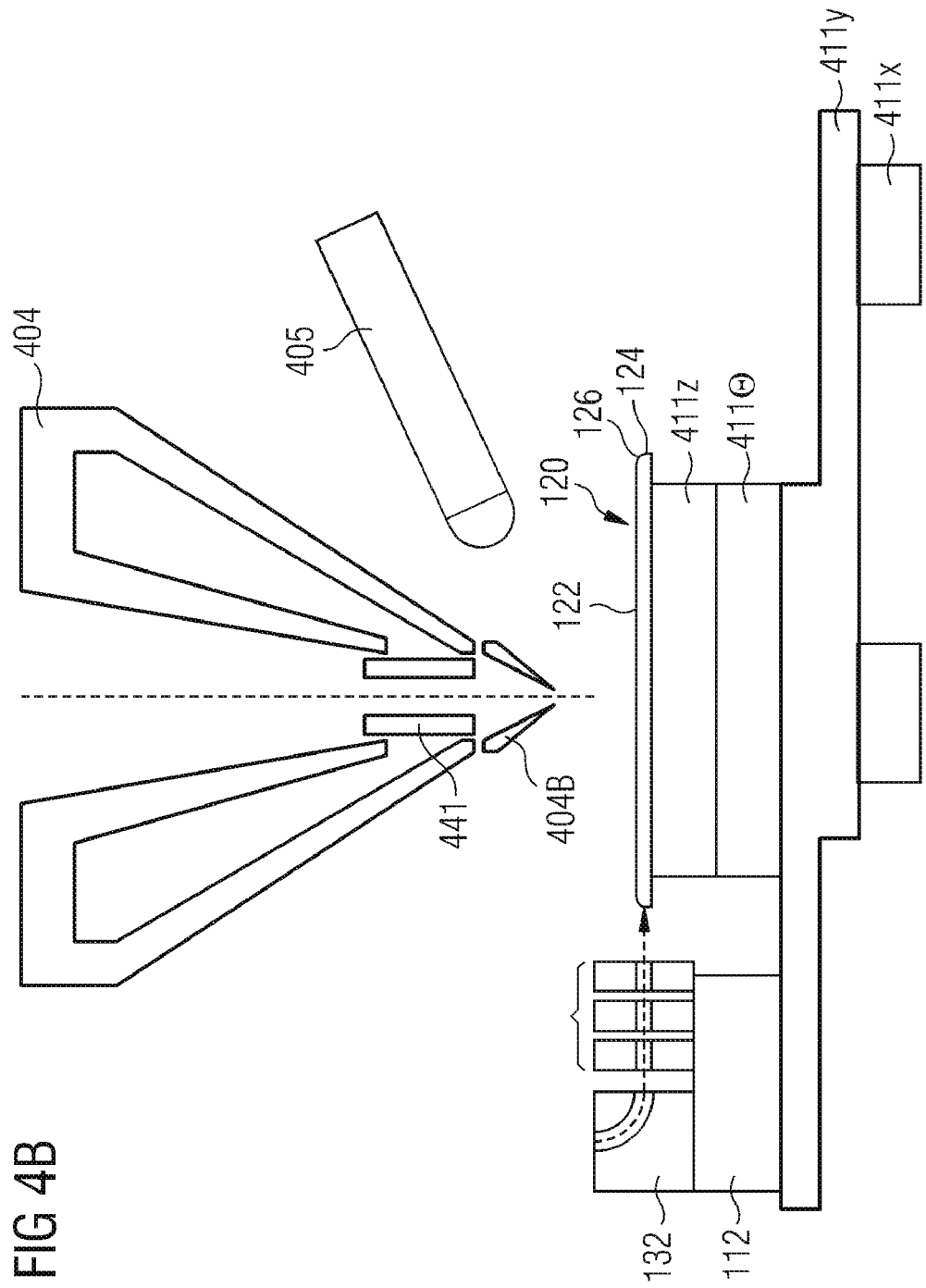
FIG. 4B shows a schematic view of the embodiment of FIG. 4A for a different imaging mode for imaging a surface of the specimen, the embodiment includes a deflection unit and a post-deflection lens for imaging an edge or a bevel of a specimen.

FIGS. 4A and 4B show a further embodiment. Within FIG. 4A, stage portion, i.e., X-direction stage 411X for moving the components thereon in X-direction is provided. Stage portion 411X holds the specimen 120 as well as the deflection unit 132 and the post-deflection lens 134. Y-direction stage is formed by a stage portion 411Y, which is able to move the components thereon in Y-direction. Further, specimen 120 can be moved in Z-direction, that is in direction of the optical axis 102, by a stage portion formed by Z-direction stage 411Z. Specimen 120 can be rotated by stage portion 411Θ. The deflection unit 132 and a post-deflection lens 134 are positioned on stage portion 112.

Within FIG. 4A, the stage is positioned such that the primary electron beam enters deflection unit 132 and is deflected towards the edge 124 or a bevel 126 of specimen 120. Within FIG. 4B, the stage is positioned, by movement of the stage portion 411Y, such that the surface 122 of the specimen 120 can be directly irradiated with the primary electron beam. In both cases detector 405 can detect secondary or backscatter particles generated by impingement of the primary electron beam. The embodiments described with regard to FIGS. 4A and 4B are, thus, capable of imaging, inspecting, or testing the edge 124, the bevel 126, and the surface 122 of the specimen 120.

In FIGS. 4A and 4B, the primary electron beam propagating along optical axis 102 is primarily focused by primary objective lens 404. Primary objective lens 404 is a combined electrostatic magnetic lens including pole pieces and electrodes 404B.

According to one embodiment, the primary electron beam is focused in the center of deflection the unit 132. Thereby, the influence of the deflection unit 132 with respect to aberrations and focusing properties can be minimized. Further, according to one embodiment, deflection unit 132 is hemispherical or close to hemispherical to provide stigmatic beam guiding properties. Yet, according to a further embodiment, the primary electron beam is focused in the center of deflection the unit 132 and deflection unit 132 is hemispherical or close to hemispherical. Within FIG. 4A, the final focus on the specimen 120 is provided by post-deflection lens 134.

FIGS. 4A and 4B show a scanning deflector 441 for scanning the primary electron beam. The primary electron beam is raster scanned over areas of the specimen. The secondary or backscattered particles are detected from the current position of impingement of the primary electron beam. Within FIG. 4A, the primary electron beam is scanned over the edge 124 or the bevel 126 of the specimen 120 by scanning deflector 441. Within FIG. 4B, the primary electron beam is scanned over the surface 122 of the specimen 120 by scanning deflector 441.

Within FIG. 4a, the entire edge or bevel of the specimen can be image, inspected, or tested by scanning the primary electron beam over a scanning area of, for example, about 100 μm×100 μm. Thereafter, the specimen can be moved to different position by stage portion 411Θ. Then, a different area of the specimen can be measured within the range of the scanning area. The wafer can have a typical thickness of, e.g., about 0.2-0.6 mm. Depending on the area of the edge or bevel being of interest for inspection also a movement of the Z-direction stage portion 411Z may be applied for measuring a different area of the edge or the bevel of the specimen within the scanning area.

Within FIG. 4B, scanning deflector 441 scans the primary electron beam over the surface 122 of the specimen 120. Again, a scanning area can be imaged, inspected, or tested and, thereafter, the specimen can be moved to a different position such that the different area of the specimen can be imaged within the scanning area.

According to one embodiment, portions of the specimen may also be imaged, inspected, or tested by a scanning movement of the primary electron beam in one dimension and a movement of the specimen in another dimension, the latter being introduced by the specimen stage.

Generally, the surface of the wafer, the edge of the wafer and the bevel of the wafer can be imaged by the embodiments described herein.

According to one embodiment, a method of imaging or inspecting a specimen in a first mode is provided. As described above, the primary electron beam is deflected towards the edge or the bevel of the specimen.

The primary particle beam may be focused by a primary objective lens before being deflected. Further, the deflection angle is typically in the range of 60° to 135°. Depending on the used deflection unit, the primary objective lens, and the resolution requirements, a post-deflection lens may be used to focus the primary electron beam after deflection.

According to another embodiment, the deflection unit for deflecting the primary electron beam towards the edge or the bevel of the specimen and the specimen is moved from a position of the first inspection mode into a position of a second inspection mode. In the position of the second inspection mode, the surface of the specimen is irradiated with the primary electron beam for imaging, inspecting, test, or patterning of the surface of the specimen.

For both measurement modes, the primary electron beam is scanned within a scanning area to raster scan a portion of the specimen. The specimen may then be repositioned to locate a different area of the edge, bevel, or surface within the scanning area. Thus, all areas of the specimen can be imaged, inspected, tested, or patterned.

FIG. 5 shows a further embodiment. Therein, a deflection unit 532 is shown. Deflection unit 532 is a focusing deflection unit. The focusing property of deflection unit 532 is utilized to image the primary electron beam on the edge or the bevel of specimen 120. A post-deflection lens is omitted in the embodiment shown in FIG. 5.

Within the embodiment shown in FIG. 6, stage portions 512X and 512Y are provided below the deflection unit and the post-deflection lens. Thereby, the deflection unit and the post-deflection lens can be moved independently of specimen 120 in X-direction and Y-direction. The independent movement in X-direction and Y-direction may be utilized for an additional adjustment of the specimen with respect to the primary electron beam. For example, the distance between the specimen and the post-deflection lens may be further adjusted. Other embodiments may include an adjustment of the distance between the specimen and the post-deflection lens by the focusing strength of the post-deflection lens.

According to another embodiment, an independent movement in X-direction and Y-direction of the deflection unit and the specimen may also be realized by further stage portions. These stage portions may, for example, be provided below specimen 120.

Figure 6:
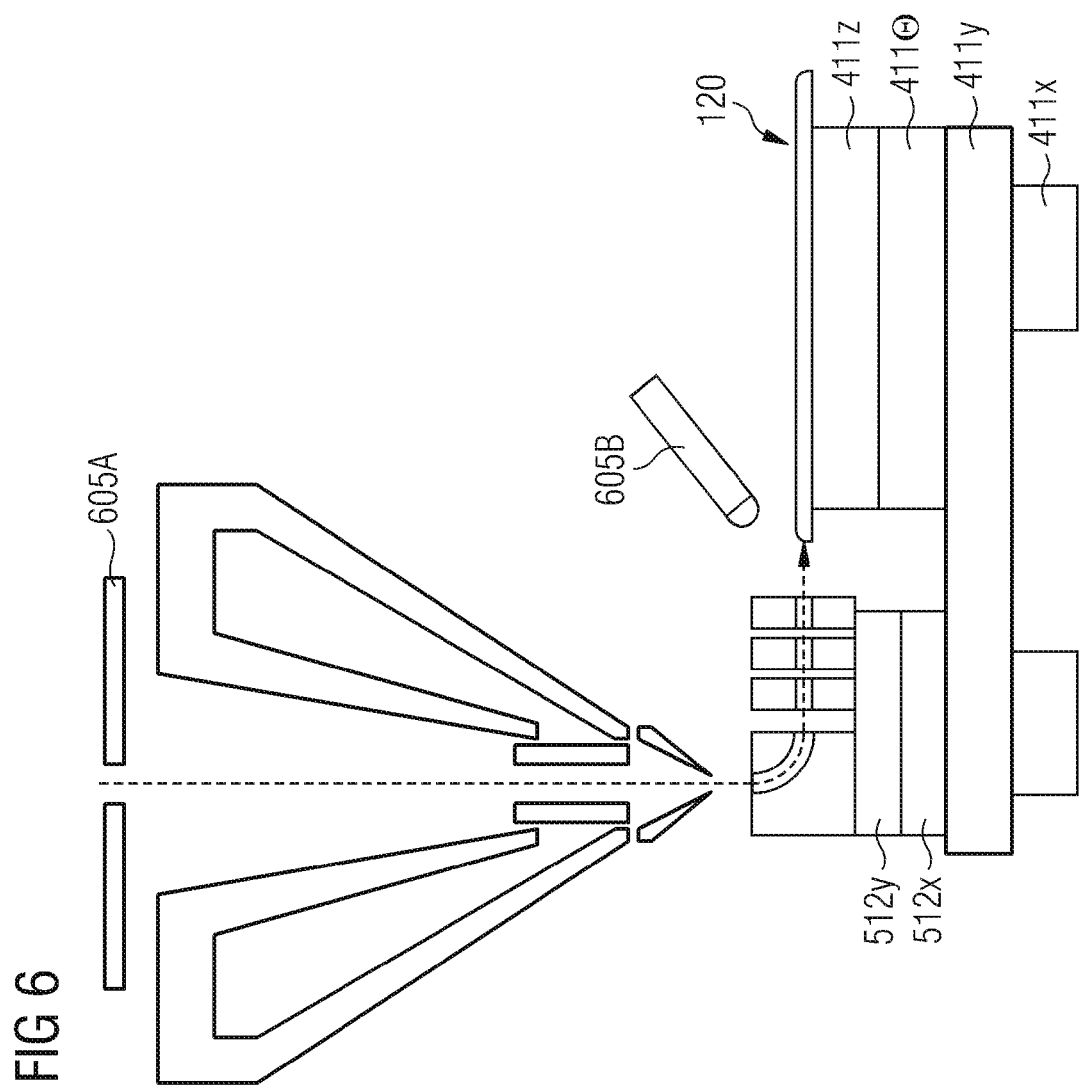
FIG. 6 shows a schematic view of an embodiment of a charged particle beam device including a deflection unit, a post-deflection lens, and separate detectors for imaging an edge or a bevel of a specimen.

The embodiments described with respect to FIG. 6 also include a first detector 605A and a second detector 605B. The first detector 605A is a disc shaped detector positioned above the primary objective lens. Detector 605A includes an opening, that may be positioned in the center, to allow the primary electron beam to pass through the detector. Further details regarding detector 605A are, for example, described in more detail in WO 99/26273, entitled "SECONDARY PARTICLE DETECTOR," filed Nov. 17, 1998, which is incorporated herewith in its entirety.

Detector 605B is positioned in the vicinity of the post-deflection lens or the area of impingement of the primary electron beam on the specimen. Thereby, secondary particles or backscatter particles generated while imaging the edge or the bevel of the specimen can be detected with detector 605B.

According to another embodiment (not shown) a detector similar to detector 405 shown in FIGS. 4A and 4B may additionally be provided. Generally, detector 405 as shown in FIGS. 4A and 4B has a detection range sufficiently large to detect secondary or backscatter charged particles from an edge/bevel measurements and a surface measurement.

The horizontal movement shown between FIGS. 4A and 4B typically is in the range of 25 to 30 mm. This movement is sufficiently small that a signal can be detected with detector 405 (see, FIGS. 4A and 4B) for both measurement modes shown in FIGS. 4A and 4B. The detector 405 in FIGS. 4A and 4B is usually positioned as close as possible to the primary objective lens 404.

Within the embodiments described herein, a detector outside the primary objective lens utilized for both measurement modes, a detector within the column, a bevel imaging detector, or a combination thereof can be provided.

According to a further embodiment, it can be desirable to measure the lower edge or bevel of the specimen. Further, it can even be desirable to measure a portion of the lower surface (the opposite surface of the specimen surface to be processed). In this case, the deflection angle is typically larger than 90°. It can be in the range of above 90° to 145°. According to one embodiment, the sector field deflector can introduce a deflection angle above 90°. According to another option, the electron beam column and the specimen stage can be tilted with respect to each other. If, for example, the optical axis of the electron beam column is tilted, a smaller deflection angle enables an impingement of the electron beam on the lower surface of the specimen. A tilt of the optical axis of the electron beam column and the specimen stage with respect to each other can, according to an even further embodiment, also be combined with a deflection in a sector field that is larger than 90°.

For the embodiments wherein a lower bevel of the specimen or a portion of the lower surface of the specimen is to be measured, a detection system according to the embodiments described with regard to FIGS. 1, 4A, 4B and 5 can be applied if the detector is able to detect secondary particles released from the specimen location on which the primary beams impinges. According to another option, also a detection system similar to the embodiments described with regard to FIG. 6 can be applied. Yet according to another option it can be desirable to provide a further detector to improve the signal generation, particularly from the lower surface of the specimen. Thereby, a further detector having improved collection efficiency from the lower surface of the specimen is provided.

For the embodiments wherein a lower bevel of the specimen or a portion of the lower surface of the specimen is to be measured, an option to switch between measurement modes, as described with regard to FIGS. 4A and 4B, can be provided. Thus, additionally to the embodiments wherein the deflection unit is movable with respect to the optical axis, that is, in a plane essentially perpendicular to the optical axis, embodiments with a fixed beam tilted or with an adjustable beam tilt can be utilized. If the optical axis is tilted with respect to the specimen surface or the specimen stage surface, the movement of the deflection unit might not be in a plane essentially perpendicular anymore.

Generally, for all embodiments described herein, a movement with respect to the optical axis is considered a movement that allows aligning the optical axis with the deflection unit and with a position on a surface of the specimen.

Figure 7:
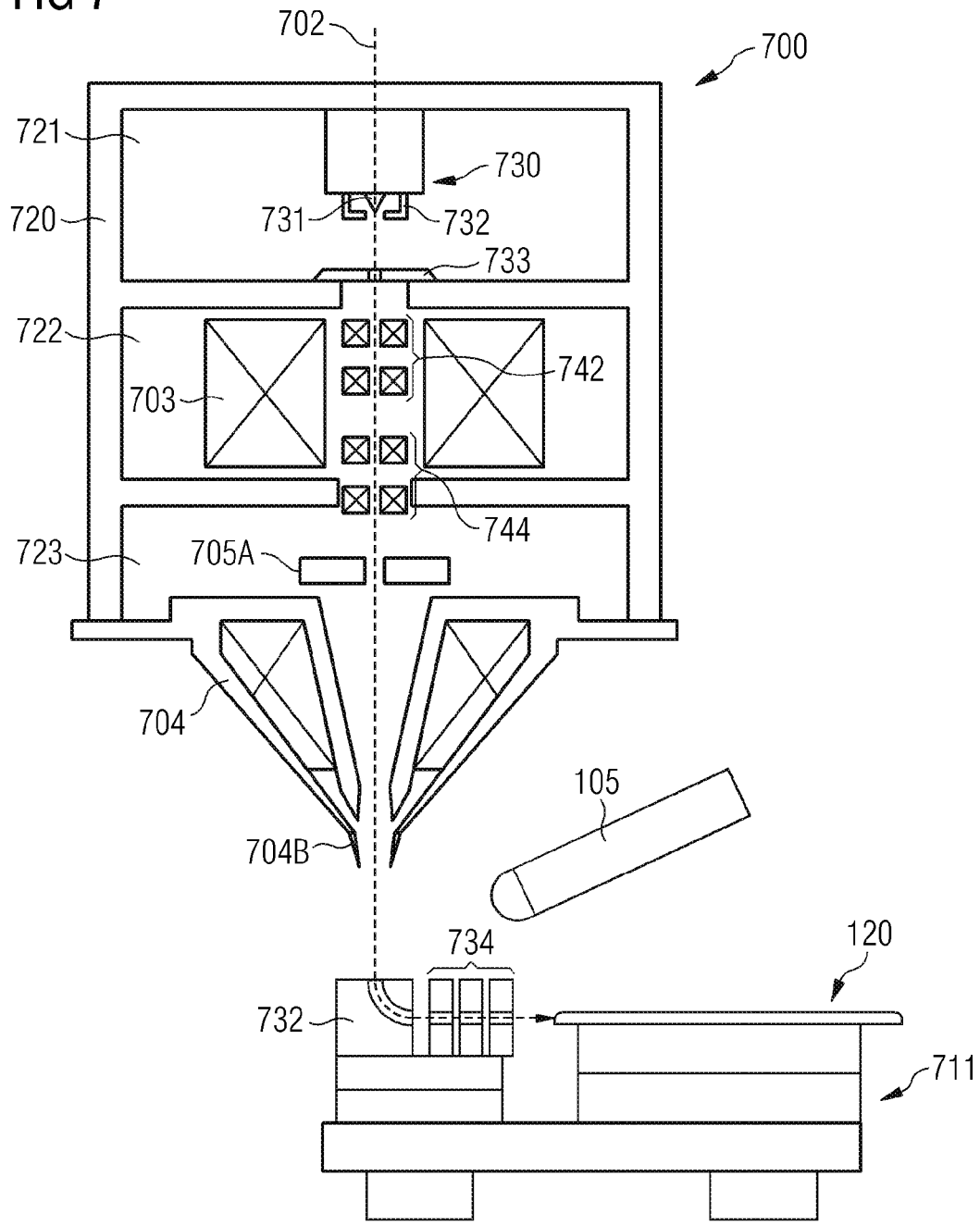
FIG. 7 shows a schematic view of an embodiment of a charged particle beam device including a deflection unit and a post-deflection lens for imaging an edge or a bevel of a specimen.

The embodiment of FIG. 7 shows a charged particle beam device 700. Electron gun 730 includes an emitter 731 and suppressor 732. The primary electron beam is emitted essentially along optical axis 702. The gun chamber 721 of housing 702 is separated by aperture 733 from the following chamber 722. The aperture 733 can also act as an anode. The primary electron beam is formed and guided by condenser lens 740 and deflection units 742 and 744 for alignment of the primary electron beam. The primary electron beam passes through the opening in detector 705A and is focused by primary objective lens 704 including electrode 704B. The specimen stage 711 is shown in a position such that the primary electron beam enters deflection unit 732 and is bend towards the edge or bevel of the specimen. Post-deflection lens 734 focuses the primary electron beam. The modification regarding the detectors, the deflection units, the post-deflection lens, and the specimen stage, which have been described with respect to FIGS. 1 to 6 can be introduced in the embodiment shown in FIG. 7.

While the foregoing is directed to embodiments of the invention, other and further embodiments of the invention may be devised without departing from the basic scope thereof, and the scope thereof is determined by the claims that follow.

The invention claimed is:

1. Charged particle beam device comprising:
   a primary objective lens for focusing a primary charged particle beam, the primary objective lens defining an optical axis;
   a specimen stage defining a specimen location area; and
   a deflection unit for deflecting the primary charged particle beam between the primary objective lens and the specimen location area, towards a beam path for impingement on a specimen, wherein the deflection unit is movable with respect to the optical axis and is positioned on the specimen stage.

2. Charged particle beam device comprising:
   a primary objective lens for focusing a primary charged particle beam, the primary objective lens defining an optical axis;
   a specimen stage defining a specimen location area, wherein the specimen stage comprises an X direction stage for movement in X-direction, a Y direction stage for movement in Y-direction, and a Z direction stage for movement in Z-direction; and
   a deflection unit for deflecting the primary charged particle beam between the primary objective lens and the specimen location area, towards a beam path for impingement on a specimen, herein the deflection unit is movable with respect to the optical axis and is adapted to follow movements of the X direction stage and the Y direction stage.

3. Charged particle beam device according to claim 2, wherein the deflection unit is rigidly coupled with the X direction stage and/or the Y direction stage.

* * * * *